United States Patent
Chen et al.

(10) Patent No.: US 9,373,391 B1
(45) Date of Patent: Jun. 21, 2016

(54) RESISTIVE MEMORY APPARATUS

(71) Applicant: Winbond Electronics Corp., Taichung (TW)

(72) Inventors: Frederick Chen, Taichung (TW);
Wen-Hsiung Chang, Taichung (TW);
Chien-Min Wu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/850,974

(22) Filed: Sep. 11, 2015

(30) Foreign Application Priority Data

Jul. 16, 2015 (CN) .......................... 2015 1 0417097

(51) Int. Cl.
*G11C 13/00* (2006.01)
*G11C 5/06* (2006.01)

(52) U.S. Cl.
CPC .............. *G11C 13/0002* (2013.01); *G11C 5/06* (2013.01); *G11C 13/0026* (2013.01); *G11C 13/0028* (2013.01)

(58) Field of Classification Search
CPC ........... G11C 13/0002; G11C 13/0026; G11C 13/0028; G11C 5/02; G11C 5/06
USPC ............................... 365/51, 72, 148, 158, 163
See application file for complete search history.

(56) References Cited

U.S. PATENT DOCUMENTS

| | | | | | |
|---|---|---|---|---|---|
| 6,072,711 | A | * | 6/2000 | Kang | G11C 11/22 257/E21.68 |
| 6,147,895 | A | * | 11/2000 | Kamp | G11C 11/22 365/117 |
| 7,499,349 | B2 | * | 3/2009 | Roehr | G11C 7/14 365/148 |
| 2005/0174841 | A1 | * | 8/2005 | Ho | G11C 11/56 365/185.03 |

* cited by examiner

*Primary Examiner* — Tan T. Nguyen
(74) *Attorney, Agent, or Firm* — Jianq Chyun IP Office

(57) ABSTRACT

A resistive memory apparatus is provided. The resistive memory apparatus includes a plurality of memory cell pairs, and each of the memory cell pairs includes an active area, first and second word lines, a source line, first and second resistors and first and second bit lines. The active area is formed on a substrate, and the first and second word lines are formed on the substrate, and intersected with the active area. The source line is formed on the substrate and coupled to the active area. The first and second resistors are disposed on the substrate, and respectively coupled to the active area. The first and second bit lines are formed on the first and second resistors and coupled to the first and second resistors. The first and second bit lines are extended along a first direction which is substantially parallel to the first and second word lines.

13 Claims, 5 Drawing Sheets

RESISTIVE MEMORY APPARATUS

CROSS-REFERENCE TO RELATED APPLICATION

This application claims the priority benefit of China application serial no. 201510417097.0, filed on Jul. 16, 2015. The entirety of the above-mentioned patent application is hereby incorporated by reference herein and made a part of this specification.

BACKGROUND

1. Technical Field

The invention relates to a resistive memory apparatus. Particularly, the invention relates to a configuration structure of memory cells of a resistive memory apparatus.

2. Related Art

Referring to FIG. 1, FIG. 1 is a circuit diagram of a conventional resistive memory apparatus. The resistive memory apparatus 100 is composed of a plurality of memory cell pairs 111-114. Taking the memory cell pair 111 as an example, the memory cell pair 111 has two memory cells 1111 and 1112, where the memory cell 1111 is constructed by a transistor T1 and a resistor R1, and the memory cell 1112 is constructed by a transistor T2 and a resistor R2.

Regarding to the conventional memory cell pairs 111-114 in FIG. 1, the memory cells in each of the memory cell pairs share a source line and a bit line. Taking the memory cell pair 111 as an example, the memory cells 1111 and 1112 in the memory cell pair 111 share the same bit line BL1 and the same source line SL1. Under the configuration of FIG. 1, the memory cell pairs 111, 113 of the same column share the same source line SL1, and the memory cell pairs 112, 114 of the same column share the same source line SL2; the memory cell pairs 111, 112 of the same row share the same bit line BL1, and the memory cell pairs 113, 114 of the same row share the same bit line BL2.

When a forming operation is performed on the resistive memory apparatus 100, if the memory cell 1111 is a selected memory cell, a word line WL1 corresponding to the memory cell 1111 is set to 3V, and other word lines WL2-WL4 are set to 0V; the bit line BL1 corresponding to the memory cell 1111 is set to 4V, and the bit line BL2 is set to 1.5V; the source line SL1 corresponding to the memory cell 1111 is set to 0V, and the source line SL2 is set to 3V. Now, nodes between the source line SL1 and the bit line BL1 coupled to the memory cells 1111 and 1112 both bear a voltage difference of 4V. Namely, the unselected memory cell 1112 is interfered by the forming operation to cause an unexpected state. Moreover, during a setting operation or a resetting operation of the resistive memory apparatus 100, the similar interferences are also occurred, which may decrease a working performance of the resistive memory apparatus 100.

SUMMARY

The invention is directed to a resistive memory apparatus, which mitigates an interference phenomenon probably generated between memory cells during operations thereof.

The invention provides a resistive memory apparatus including a plurality of memory cell pairs disposed on a substrate in an array, and each of the memory cell pairs includes an active area, a first word line and a second word line, a source line, a first resistor and a second resistor, a first bit line and a second bit line. The active area is formed on the substrate, and the first word line and the second word line are formed on the substrate, and are intersected with the active area. The source line is formed on the substrate and is coupled to the active area. The first resistor and the second resistor are disposed on the substrate, and are respectively coupled to the active area. The first bit line and the second bit line are formed on the first resistor and the second resistor, and are coupled to the first resistor and the second resistor. The first bit line and the second bit line are extended along a first direction which is substantially parallel to the first word line and the second word line.

According to the above description, in the resistive memory apparatus of the invention, the memory cells in the memory cell pair structure are respectively coupled to different bit lines. In this way, in the resistive memory apparatus, the memory cells coupled to the same source line are respectively coupled to different bit lines, and the memory cells coupled to the same bit line are respectively coupled to different source lines. Therefore, during the forming, setting or resetting operation of the resistive memory apparatus, the interference formed between the memory cells can be effectively mitigated, so as to improve a working performance of the resistive memory apparatus.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
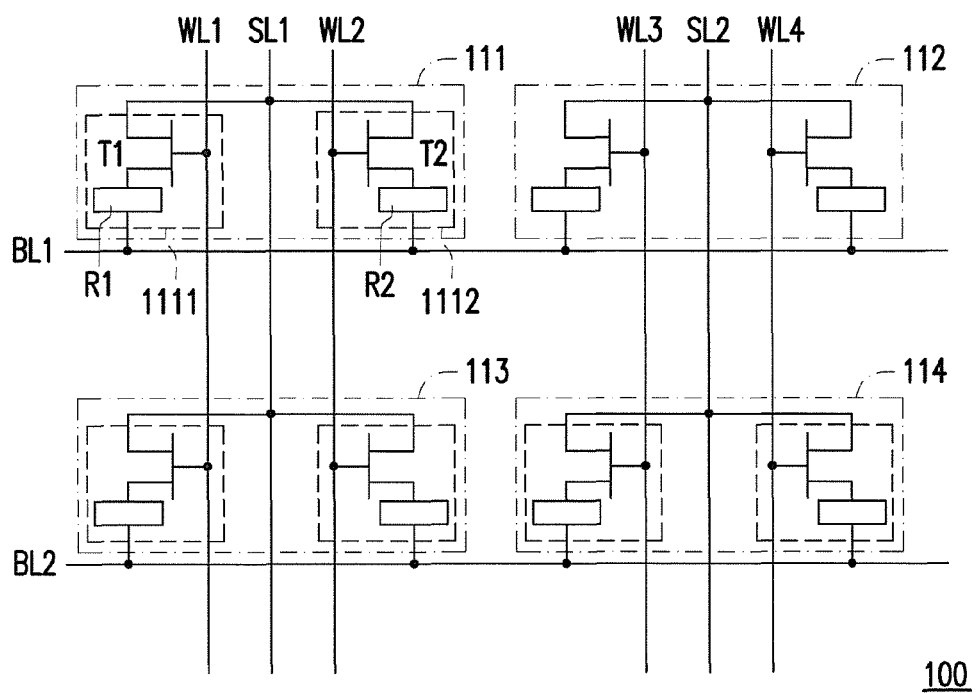
FIG. 1 is a circuit diagram of a conventional resistive memory apparatus.
Figure 2A:
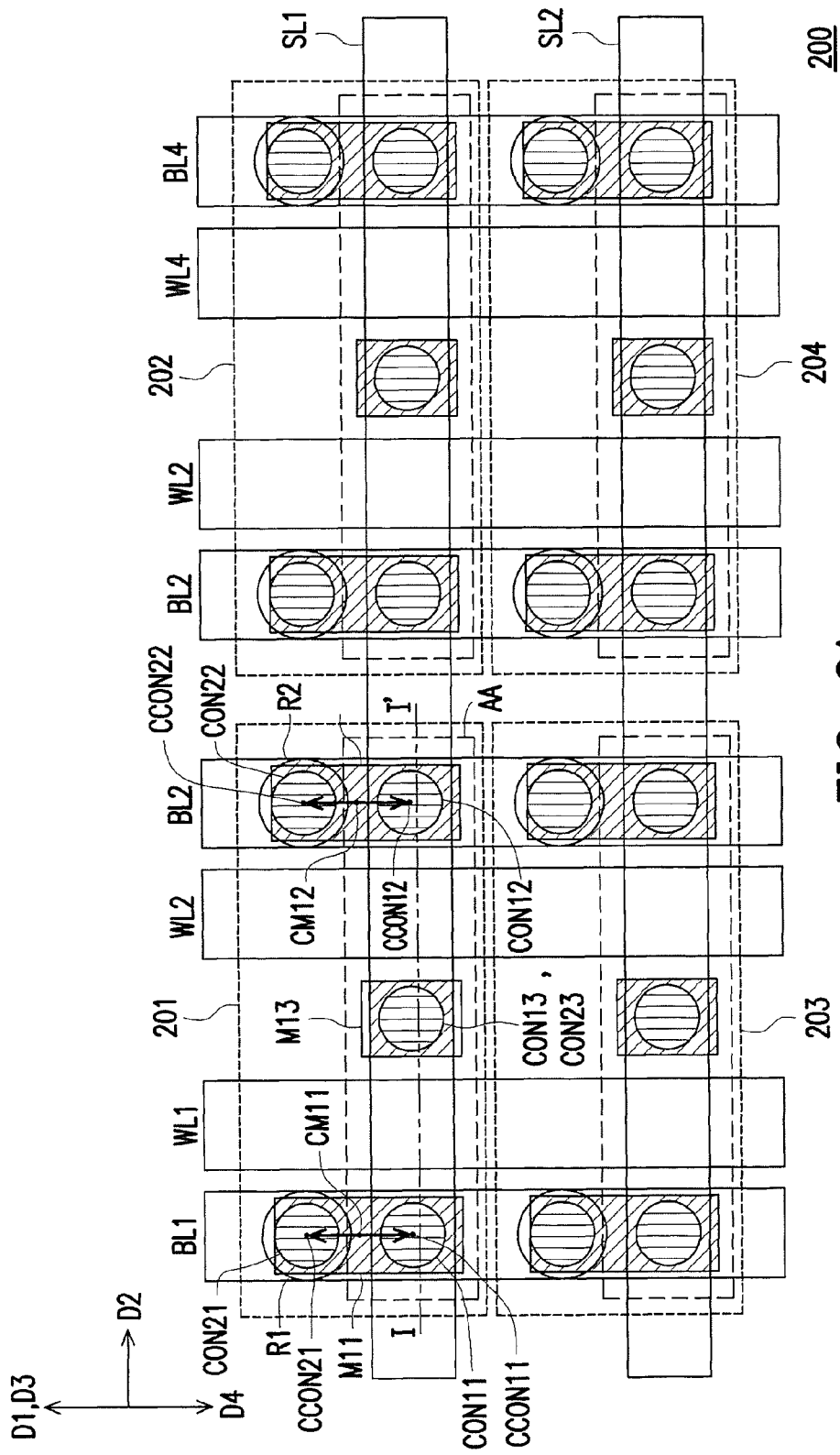
FIG. 2A is a layout schematic diagram of a resistive memory apparatus 200 according to an embodiment of the invention.
Figure 2B:
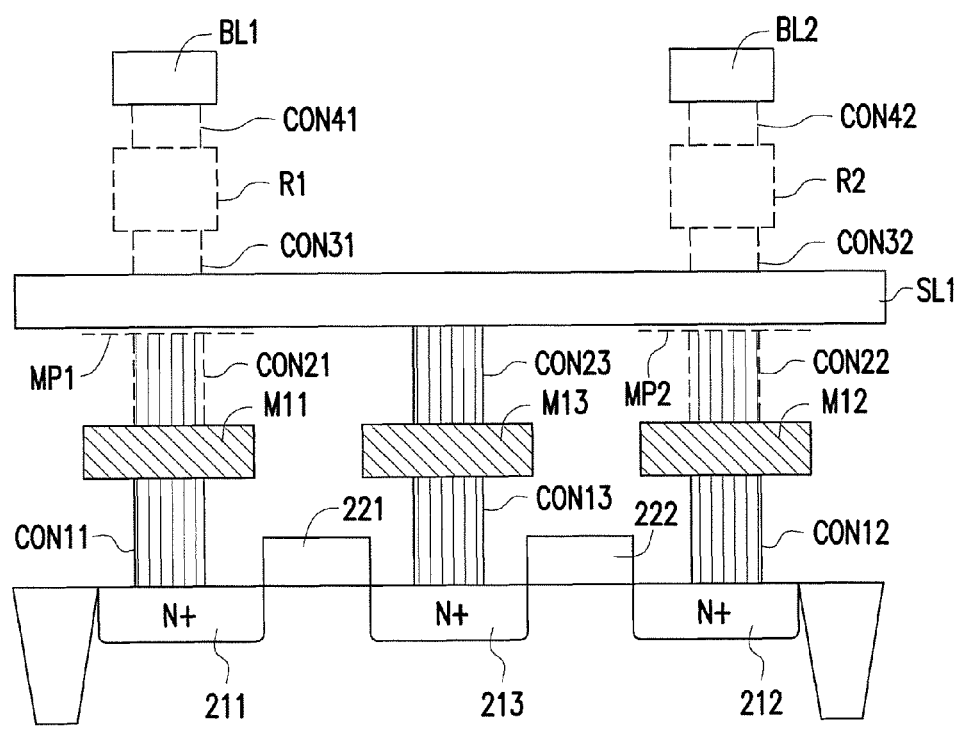
FIG. 2B is a cross-sectional view of the resistive memory apparatus 200 of FIG. 2A viewing along a section line I-I'.

FIG. 2A is a layout schematic diagram of a resistive memory apparatus 200 according to an embodiment of the invention. FIG. 2B is a cross-sectional view of the resistive memory apparatus 200 of FIG. 2A viewing along a section line I-I'. Referring to FIG. 2A and FIG. 2B, the resistive memory apparatus 200 includes a plurality of memory cell pairs 201-204 arranged in an array. Taking the memory cell pair 201 as an example, the memory cell pairs 201 includes an active area AA, resistors R1 and R2, a source line SL1, word lines WL1 and WL2 and bit lines BL1 and BL2. The word lines WL1 and WL2 are formed on the substrate 210 and extend along a direction D1. Regions of the active area AA that are covered by the word lines WL1 and WL2 may respectively form a first gate structure 221 and a second gate structure 222 coupled to the resistor R1 and the resistor R2. Regions of the active area AA that are not covered by the word lines WL1 and WL2 can be respectively doped to form source/drain regions 211-213. The source line SL1 is formed on the active area AA and extends along a direction D2, and the source line SL1 can be coupled to the source/drain region 213 through a connection structure CON23, a metal layer M13 and a connection structure CON13. The resistor R1 is formed above the substrate 210, and can be connected to the source/drain region 211 at another side of the word line WL1 through a connection structure CON31, a metal layer MP1, a connection structure CON21, a metal layer M11 and a connection structure CON11. The bit line BL1 is formed on the resistor R1 and substantially extends along the direction D1 parallel to the word line WL1, and the bit line BL1 can be directly coupled to the resistor R1 or coupled to the resistor R1 through a connection structure CON41. The resistor R2 is formed above the substrate 210, and can be connected to the source/drain region 212 at another side of the word line WL2 through a connection structure CON32, a metal layer MP2, a connection structure CON22, a metal layer M12 and a connection structure CON12. The bit line BL2 is formed on the resistor R2 and substantially extends along the direction D1 parallel to the word line WL1, and the bit line BL2 can be directly coupled to the resistor R2 or coupled to the resistor R2 through a connection structure CON42. It should be noted that in the present embodiment, the source line SL1 is coupled to the source/drain region 213 through the connection structures CON13, CON23 and the metal layer M13, the resistor R1 is coupled to the source/drain region 211 through the connection structures CON11, CON21, CON31 and the metal layers M11, MP1, and the resistor R2 is coupled to the source/drain region 212 through the connection structures CON12, CON22, CON32 and the metal layers M12, MP2, though the invention is not limited thereto, and the source line SL and the resistors R1, R2 can also be coupled to the source/drain regions through more or less layers of the connection structures or the metal layers according to an actual manufacturing demand.

It should be noted that as shown in FIG. 2A, the connection structure CON21 has a center CCON21, the metal layer M11 has a metal layer center CM11, and the connection structure CON11 has a center CCON11. The center CCON21 of the connection structure CON21 is set by shifting the metal layer center CM11 of the metal layer M11 along a direction D3, and the center CCON11 of the connection structure CON11 is set by shifting the metal layer center CM11 of the metal layer M11 along a direction D4. On the other hand, the connection structure CON22 has a center CCON22, the metal layer M12 has a metal layer center CM12, and the connection structure CON12 has a center CCON12. The center CCON22 of the connection structure CON22 is set by shifting the metal layer center CM12 of the metal layer M12 along the direction D3, and the center CCON12 of the connection structure CON12 is set by shifting the metal layer center CM12 of the metal layer M12 along the direction D4. It should be noted that in the present embodiment, the direction D1 and the direction D3 are the same directions, though the invention is not limited thereto, and in other embodiments, the direction D1 and the direction D3 can be different directions. Moreover, in the present embodiment, the direction D3 and the direction D4 are parallel and in opposite directions, though the invention is not limited thereto, and in other embodiments, the direction D3 can just be different to the direction D4. As shown in FIG. 2A, in the invention, by shifting positions of the connection structures CON11, CON21, CON12, CON22 and the metal layers M11 and M12, the bit lines of the resistive memory apparatus can be configured in a manner substantially parallel to the word lines.

Figure 3:
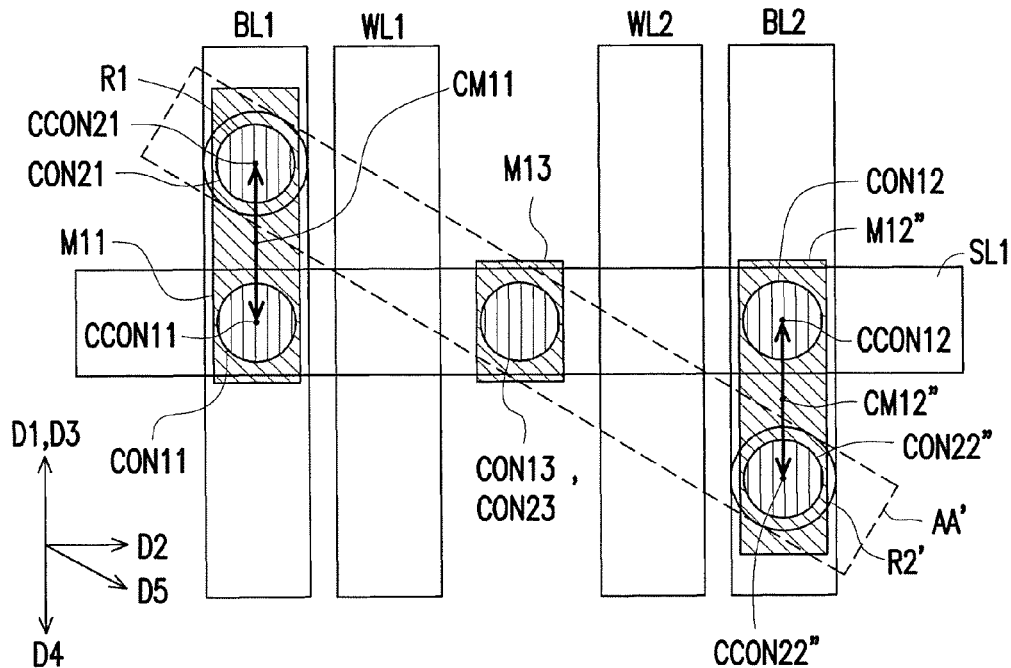
FIG. 3 is a layout schematic diagram of a memory cell pair of FIG. 2A according to another embodiment of the invention.

Referring to FIG. 3, FIG. 3 is a layout schematic diagram of the memory cell pair of FIG. 2A according to another embodiment of the invention. Different to the embodiment of FIG. 2A, the active area AA shown in the embodiment of FIG. 2A is extended along the direction D2 substantially parallel to the source line SL1, though the active area AA' of the present embodiment is extended along a direction D5 not parallel to the source line SL1. Moreover, the source line SL1 of the embodiment of FIG. 2A covers the active area AA, and the direction D2 is perpendicular to the direction D1. In the present embodiment, the source line SL1 only covers a part of the active are AA', and the direction D2 is intersected with and not perpendicular to the direction D1. Moreover, the connection structures CON13, CON23 and the metal layer M13 coupled to the source line SL1 and the active area AA' are disposed at an intersection of the source line SL1 and the active area AA'. It should be noted that the metal layer M12" and the connection structure CON22" of the present embodiment respectively have a metal layer center CM12" and a center CCON22". The center CCON22" of the connection structure CON22" is set by shifting the metal layer center CM12" of the metal layer M12" along the direction D4, and the center CCON12 of the connection structure CON12 is set by shifting the metal layer center CM12" of the metal layer M12" along the direction D3. As shown in FIG. 3, in the invention, by extending the active area AA' and the source line SL1 along different directions, the bit lines of the resistive memory apparatus can be configured in a manner substantially parallel to the word lines.

Figure 4A:
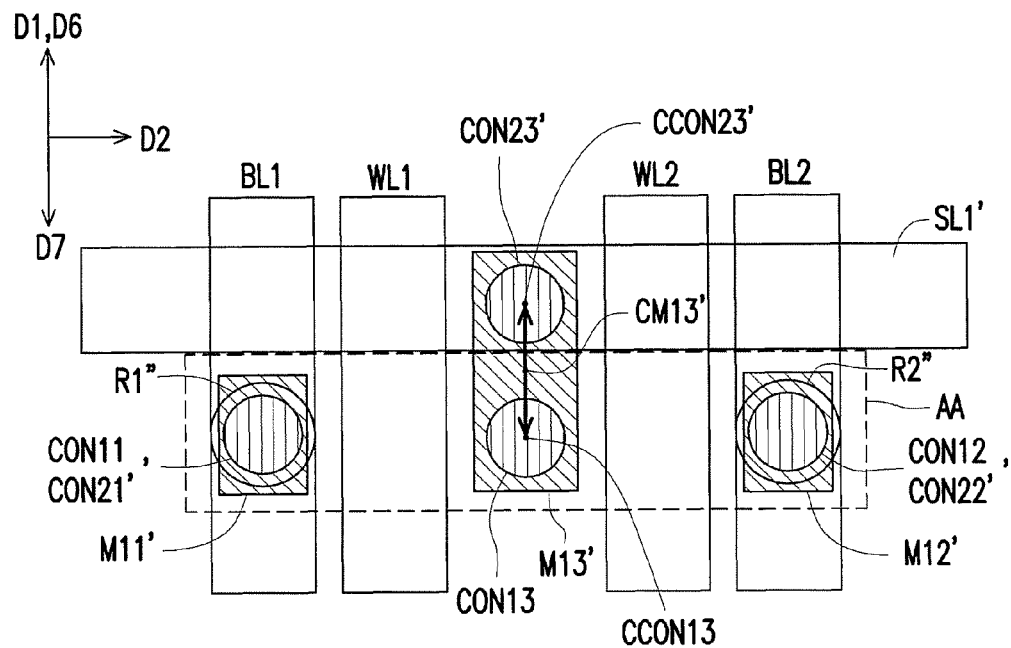
FIG. 4A is a layout schematic diagram of the memory cell pair of FIG. 2A according to still another embodiment of the invention.

Referring to FIG. 4A, FIG. 4A is a layout schematic diagram of the memory cell pair of FIG. 2A according to still another embodiment of the invention. Different to the embodiment of FIG. 2A, the source line SL1 of the embodiment of FIG. 2A is disposed above the active area AA, and the resistor R1 and the resistor R2 are coupled to the active area AA by shifting the positions of the connection structures CON11, CON21, CON12, CON22 and the metal layers M11, M12. In the present embodiment, the resistor R1" and the resistor R2" are disposed above the active area AA, and the source line SL1' is coupled to the active area AA by shifting positions of the connection structures CON13, CON23' and the metal layer M13'. Particularly, referring to FIG. 4A, the connection structure CON23' has a center CCON23', the metal layer M13' has a metal layer center CM13', and the connection structure CON13 has a center CCON13. The center CCON23' of the connection structure CON23' is set by shifting the metal layer center CM13' of the metal layer M13' along a direction D6, and the center CCON13 of the connection structure CON13 is set by shifting the metal layer center CM13' of the metal layer M13' along a direction D7. As shown in FIG. 4A, by shifting the positions of the connection structures CON13, CON23' and the metal layer M13', the bit lines BL1 and BL2 of the resistive memory apparatus can be configured in a manner substantially parallel to the word lines WL1 and WL2.

Figure 4B:
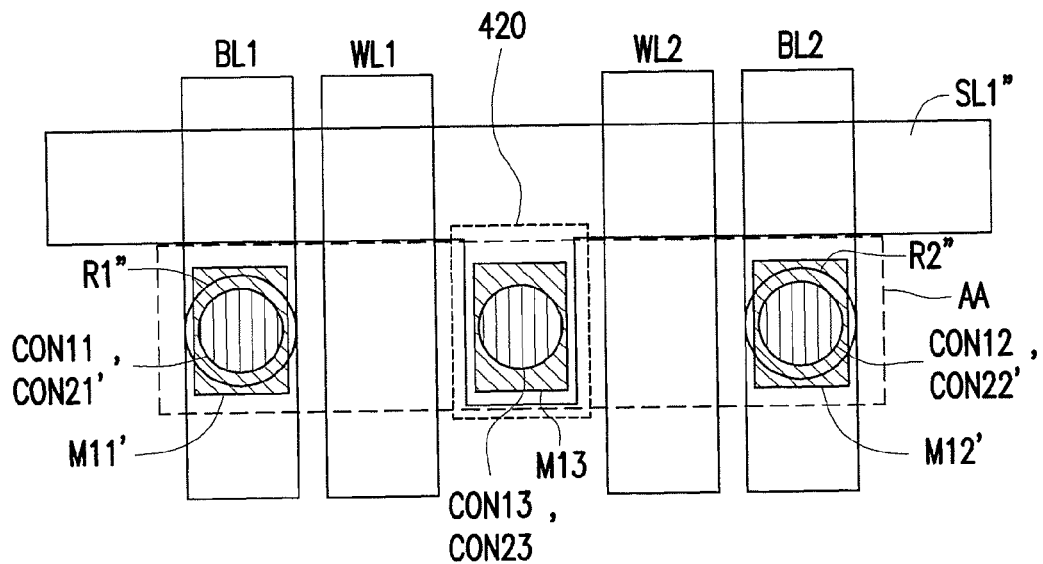
FIG. 4B is a layout schematic diagram of the memory cell pair of FIG. 4A according to another embodiment of the invention.

Referring to FIG. 4B, FIG. 4B is a layout schematic diagram of the memory cell pair of FIG. 4A according to another embodiment of the invention. Different to the embodiment of FIG. 4A, the source line SL1" of the present embodiment has a protrusion portion 420, and the protrusion portion 420 is formed above the connection structure CON23 and covers a part of the active area AA, so that in the present embodiment, the bit lines BL1 and BL2 of the resistive memory apparatus can be configured in a manner substantially parallel to the word lines WL1 and WL2 without shifting the positions of the connection structures CON13, CON23 and the metal layer M13.

It should be noted that in each of the aforementioned embodiments, the bit lines, the word lines and the source lines of the memory cell pairs manufactured in form of a chip can be formed by a material using as wires in the chip, for example, a metal layer, and the connection structure can be formed by a via or contact in the chip.

Figure 5:
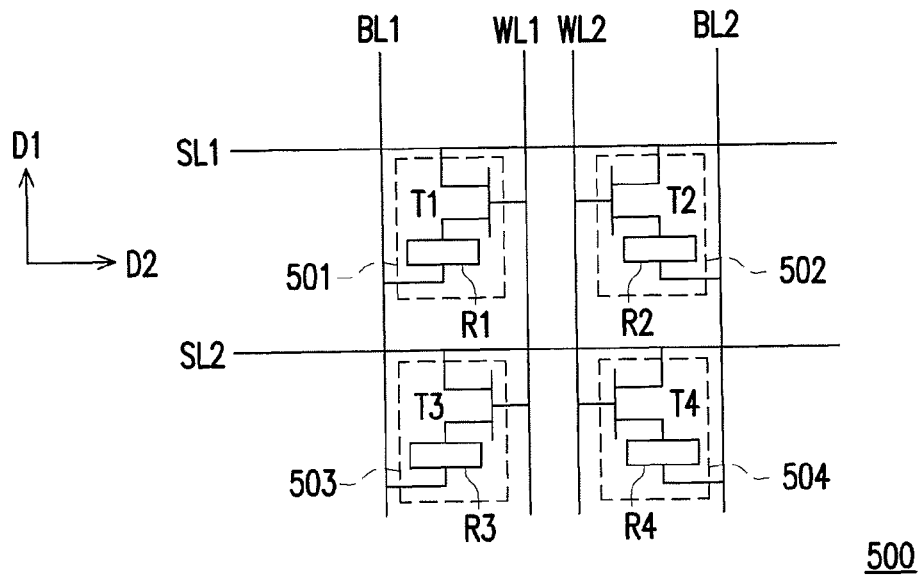
FIG. 5 is an equivalent circuit diagram of a resistive memory apparatus according to an embodiment of the invention.

Referring to FIG. 5, FIG. 5 is an equivalent circuit diagram of a resistive memory apparatus according to an embodiment of the invention. The resistive memory apparatus 500 includes a plurality of memory cells 501-504. The memory cells 501-504 respectively include transistors T1-T4, and respectively include resistors R1-R4. Taking the memory cell 501 as an example, a source of the transistor T1 is coupled to the source line SL1, and a drain of the transistor T1 is coupled to the resistor R1, and another end of the resistor R1 is coupled to the bit line BL1.

In the embodiment of FIG. 5, the memory cells 501 and 502 share the source line SL1, and are respectively coupled to the bit lines BL1 and BL2; the memory cells 503 and 504 share the source line SL2, and are respectively coupled to the bit lines BL1 and BL2. The memory cells 501 and 503 share the bit line BL1, and are respectively coupled to the source lines SL1 and SL2, and the memory cells 502 and 504 share the bit line BL2, and are respectively coupled to the source lines SL1 and SL2. Moreover, the word lines and the bit lines are substantially parallel to each other and extend along the direction D1, and the source lines are configured to extend along the direction D2 different to the direction D1.

When a forming operation is performed on the resistive memory apparatus 500, if the memory cell 503 is a selected memory cell (the memory cells 501, 502 and 504 are unselected memory cells), a voltage of the bit line BL1 is, for example, set to 4V, voltages of the source lines SL1 and SL2 can be respectively set to 3V and 0V, a voltage of the bit line BL2 can be set to 1.5V, and voltages of the word lines WL1 and WL2 are respectively set to 3V and 0V. In this way, the transistor T3 can be turned on according to the voltage of the word line WL1, and executes the forming operation according to a voltage difference (4.0V) between the bit line BL1 and the source line SL2. Meanwhile, a voltage difference borne by the memory cell 504 is equal to the voltage of the bit line BL2 minus the voltage of the source line SL2, i.e. 1.5V. Namely, the interference on the memory cell 504 is effectively mitigated, so as to mitigate a probably generated leakage phenomenon.

Moreover, when a setting operation is performed on the resistive memory apparatus 500, if the memory cell 503 is the selected memory cell (the memory cells 501, 502 and 504 are unselected memory cells), the voltage of the bit line BL1 is, for example, set to 2V, the voltages of the source lines SL1 and SL2 can be respectively set to 1V and 0V, the voltage of the bit line BL2 can be set to 0V, and the voltages of the word lines WL1 and WL2 are respectively set to 3V and 0V. In this way, the transistor T3 can be turned on according to the voltage of the word line WL1, and executes the setting operation according to a voltage difference (2.0V) between the bit line BL1 and the source line SL2. Meanwhile, the voltage differences borne by the memory cells 501 and 502 are respectively about 1V and −1V, and a voltage difference borne by the memory cell 504 is about 0V. Namely, the interference on the memory cells 501, 502 and 504 is effectively mitigated, so as to mitigate the probably generated leakage phenomenon.

Moreover, when a resetting operation is performed on the resistive memory apparatus 500, if the memory cell 503 is the selected memory cell (the memory cells 501, 502 and 504 are unselected memory cells), the voltage of the bit line BL1 is, for example, set to 0V, the voltages of the source lines SL1 and SL2 can be respectively set to 0V and 2V, the voltage of the bit line BL2 can be set to 1V, and the voltages of the word lines WL1 and WL2 are respectively set to 5V and 0V. In this way, the transistor T3 can be turned on according to the voltage of the word line WL1, and executes the resetting operation according to a voltage difference (−2.0V) between the bit line BL1 and the source line SL2. Meanwhile, voltage differences borne by the memory cells 501, 502 and 504 are respectively about 0V, 1V and −1V. Namely, the interference on the memory cells 501, 502 and 504 is effectively mitigated, so as to mitigate the probably generated leakage phenomenon.

In summary, in the memory cell pairs provided by the invention, the bit lines of the resistive memory apparatus are configured in a manner substantially parallel to the word lines, such that when various operations are performed on the memory cell in the resistive memory apparatus, the voltage of at least one of the bit lines and the source lines of each of the memory cell can be individually set, so as to mitigate the influence of the adjacent memory cells to cause the interference and leakage phenomenon during the operation, and accordingly improve a working performance of the resistive memory apparatus.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A resistive memory apparatus, comprising:
    a plurality of memory cell pairs, disposed on a substrate in an array, and each of the memory cell pairs comprising:
        an active area, formed on the substrate;
        a first word line and a second word line, formed on the substrate, and intersected with the active area;
        a source line, formed on the substrate, and coupled to the active area;
        a first resistor and a second resistor, disposed on the substrate, and respectively coupled to the active area; and
        a first bit line and a second bit line, respectively formed on the first resistor and the second resistor, and coupled to the first resistor and the second resistor,
    wherein the first bit line and the second bit line are extended along a first direction which is substantially parallel to the first word line and the second word line.

2. The resistive memory apparatus as claimed in claim 1, wherein the active area is disposed on the substrate along a second direction, and the first direction is substantially intersected with the second direction.

3. The resistive memory apparatus as claimed in claim 2, wherein the source line is disposed along a third direction, and covers at least a part of the active area.

4. The resistive memory apparatus as claimed in claim 3, further comprising a first connection structure, wherein the first connection structure is disposed in a region where the source line is overlapped with the active region, and the source line is coupled to the active area through the first connection structure.

5. The resistive memory apparatus as claimed in claim 4, wherein the source line is formed above the active area, and the third direction is substantially the same to the second direction, and the resistive memory apparatus further comprises:
   a second connection structure, disposed above the active area, and coupled to the first resistor.

6. The resistive memory apparatus as claimed in claim 5, wherein the second connection structure has a second center, and the resistive memory apparatus further comprises:
   a first metal layer, disposed above the second connection structure, and having a first metal layer center; and
   a third connection structure, disposed above the first meta layer, coupled to the source line, and having a third center,
   wherein the second center is shifted from the first metal layer center along a fourth direction, and the third center is shifted from first metal layer center along a fifth direction.

7. The resistive memory apparatus as claimed in claim 6, further comprising:
   a fourth connection structure, disposed above the active area, and having a fourth center;
   a second metal layer, disposed above the fourth connection structure, and having a second metal layer center; and
   a fifth connection structure, disposed above the second metal layer, coupled to the source line, and having a fifth center,
   wherein the fourth center is shifted from the second metal layer center along the fifth direction, and the fourth center is shifted from the second metal layer center along the fourth direction.

8. The resistive memory apparatus as claimed in claim 7, wherein the first resistor and the second resistor are shifted from the fourth line along the fifth direction.

9. The resistive memory apparatus as claimed in claim 7, wherein the first resistor is shifted from the source line along the fifth direction, and the second resistor is shifted from the source line along the fourth direction.

10. The resistive memory apparatus as claimed in claim 4, wherein the third direction is substantially the same to the second direction, and the source line has a protrusion portion covering the part of the active area.

11. The resistive memory apparatus as claimed in claim 2, wherein the source line is extended along the second direction which is substantially parallel to the active area, the first connection structure has a first center, and the resistive memory apparatus further comprises:
   a first metal layer, disposed above the first connection structure, and having a first metal layer center; and
   a second connection structure, disposed above the first metal layer, coupled to the source line, and having a second center,
   wherein the first center is shifted from the first metal layer center along a third direction, and the second center is shifted from the first metal layer center along a fourth direction.

12. The resistive memory apparatus as claimed in claim 11, wherein the third direction is opposite to the fourth direction.

13. The resistive memory apparatus as claimed in claim 1, wherein the memory cell pairs of a same column share the same first bit line, the second bit line, the first word line and the second word line, and the memory cell pairs of a same row share the same source line.

* * * * *